United States Patent [19]

Tanaka

[11] 4,224,585
[45] Sep. 23, 1980

[54] METHODS AND APPARATUS FOR COMPENSATING FOR CHARGE TRANSFER INEFFICIENCY IN IMAGING AND OTHER VARIABLE LENGTH CHARGE TRANSFER DEVICES

[75] Inventor: Satoru C. Tanaka, Milpitas, Calif.

[73] Assignee: Reticon Corporation, Sunnyvale, Calif.

[21] Appl. No.: 937,447

[22] Filed: Aug. 28, 1978

[51] Int. Cl.³ .................... H03H 17/04; H03K 5/14; G11C 27/02; G11C 19/28

[52] U.S. Cl. .............................. 333/165; 307/221 D; 357/30; 358/213

[58] Field of Search ............... 357/30, 24; 358/213; 307/221 D, 221 R, 221 C, 304; 333/165, 166

[56] References Cited

U.S. PATENT DOCUMENTS

| | | | |
|---|---|---|---|
| 3,868,516 | 2/1975 | Buss | 307/221 D |
| 3,946,248 | 3/1976 | Buss | 307/221 D |
| 3,999,171 | 12/1976 | Parsons | 307/221 D X |
| 4,047,053 | 9/1977 | Ley et al. | 307/221 D X |

Primary Examiner—Marvin L. Nussbaum

Attorney, Agent, or Firm—Blakely, Sokoloff, Taylor & Zafman

[57] ABSTRACT

Methods and apparatus for compensating for charge transfer inefficiency in imaging and other variable length charge transfer devices are disclosed. In accordance with the method a recursive filter is used to compensate for the transfer inefficiency of the device with the coefficients of the recursive filter being dependent upon the pixel position and the inefficiency per transfer, or more particularly upon the inefficiency per transfer and the number of transfers required to transfer from the pixel position to the output of the charge transfer device. In addition, a variable gain control is used to restore the amplitude of the output signal dependent upon the pixel position and inefficiency per transfer. Substantial compensation is achieved utilizing recursive filter coefficients linearly increasing with the number of transfers required, with an automatic gain control amplifier also linearly increasing in gain proportional to the number of transfers required to restore signal amplitude. Test results and apparatus for practicing the invention are also disclosed, as are other compensation techniques.

26 Claims, 10 Drawing Figures

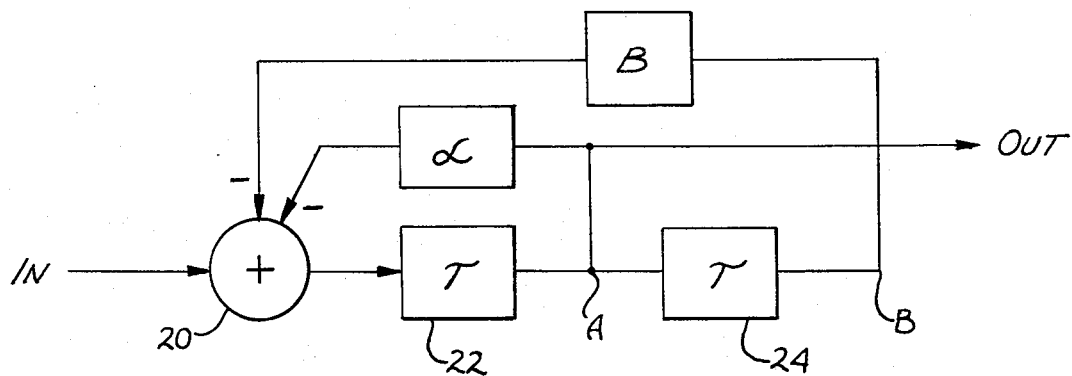
Fig. 1
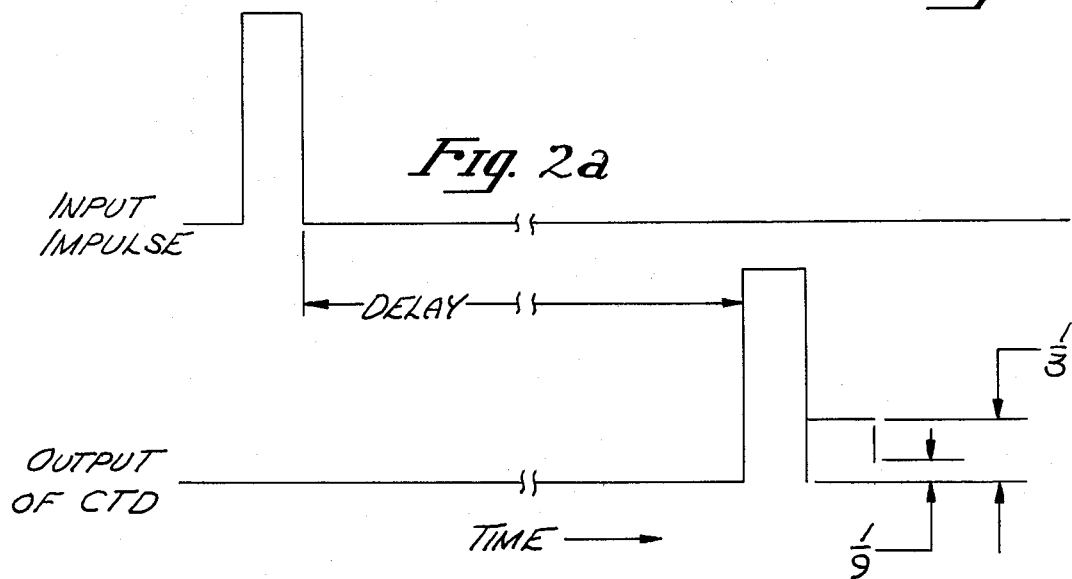
Fig. 2a
| SAMPLE TIMES | NODES | | | FILTER OUTPUT |
| --- | --- | --- | --- | --- |
| | IN | A | B | |
| 0 | 1 | 0 | 0 | 0 |
| 1 | =1/3 | 1 | 0 | 1 |
| 2 | =1/9 | 0 | 1 | 0 |
| 3 | 0 | 0 | 0 | 0 |
Fig. 2b

| | | CELL NUMBERS | | | | | CTD OUTPUT |
|---|---|---|---|---|---|---|---|
| | | 1 | 2 | 3 | 4 | 5 | |
| CLOCK TIME | 0 | 7 | 4 | 2 | 5 | 6 | |
| | 1 | $0(1-\varepsilon)$<br>$7\varepsilon$ | $7(1-\varepsilon)$<br>$4\varepsilon$ | $4(1-\varepsilon)$<br>$2\varepsilon$ | $2(1-\varepsilon)$<br>$5\varepsilon$ | $5(1-\varepsilon)$<br>$6\varepsilon$ | $6(1-\varepsilon)$ |
| | 2 | $0(1-\varepsilon)$<br>$0(1-\varepsilon)\varepsilon$<br>$7\varepsilon^2$ | $0(1-\varepsilon)^2$<br>$7\varepsilon(1-\varepsilon)$<br>$7(1-\varepsilon)\varepsilon$<br>$4\varepsilon^2$ | $7(1-\varepsilon)^2$<br>$4\varepsilon(1-\varepsilon)$<br>$4(1-\varepsilon)\varepsilon$<br>$2\varepsilon^2$ | $4(1-\varepsilon)^2$<br>$2\varepsilon(1-\varepsilon)$<br>$2(1-\varepsilon)\varepsilon$<br>$5\varepsilon^2$ | $2(1-\varepsilon)^2$<br>$5\varepsilon(1-\varepsilon)$<br>$5(1-\varepsilon)\varepsilon$<br>$6\varepsilon^2$ | $5(1-\varepsilon)^2$<br>$6\varepsilon(1-\varepsilon)$ |

*Fig. 3*

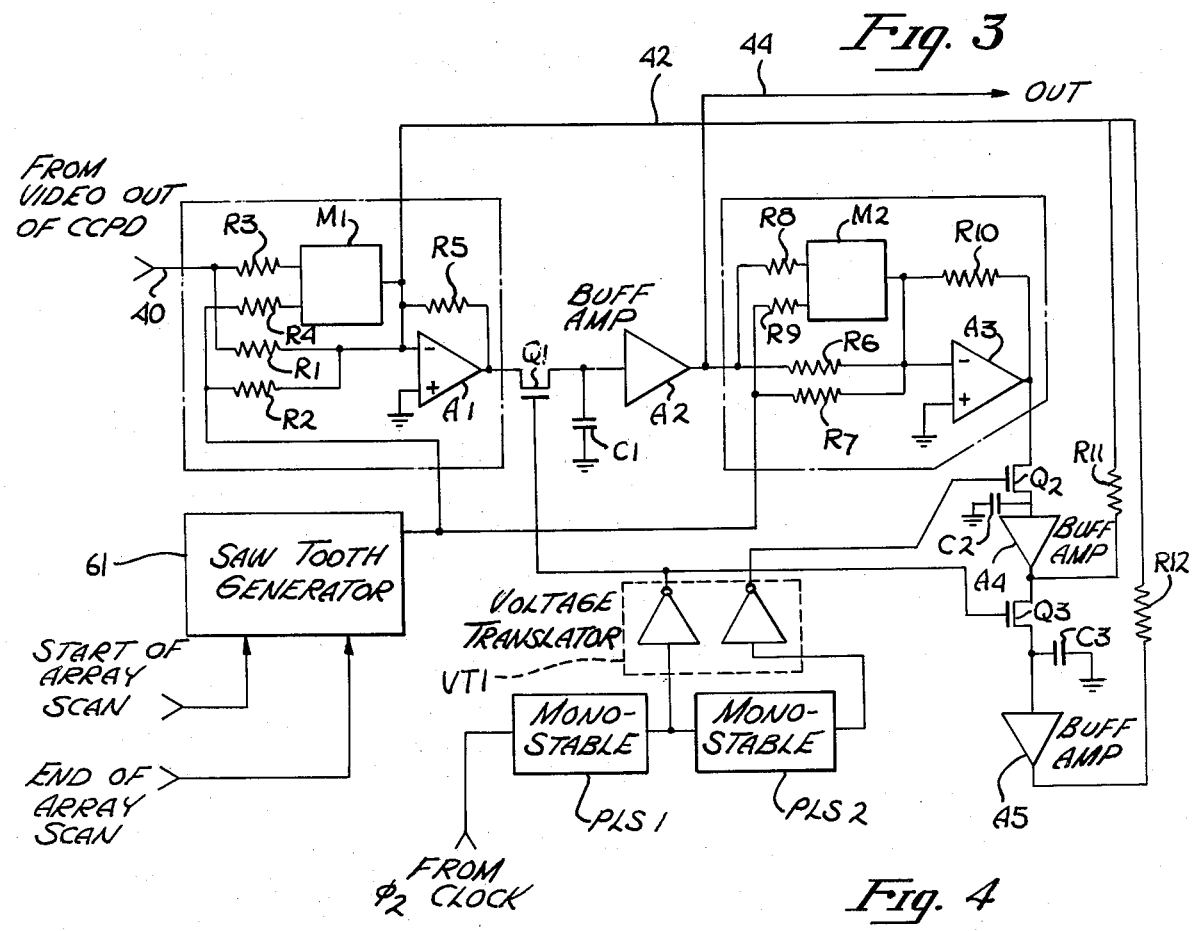

*Fig. 4*

METHODS AND APPARATUS FOR COMPENSATING FOR CHARGE TRANSFER INEFFICIENCY IN IMAGING AND OTHER VARIABLE LENGTH CHARGE TRANSFER DEVICES

BACKGROUND OF THE INVENTION

1. Field of the Invention

The present invention relates to the field of charge transfer devices.

2. Prior Art

Many investigators have studied the effects of transfer inefficiency on the modulation transfer function in both signal processing and optical charge transfer devices. Transfer inefficiency in charge transfer devices exhibits itself as a frequency response degradation in signal processing devices, and as an image smearing in optical devices. In contrast, a few investigators have studied methods for compensating the effects of transfer inefficiency in the area of signal processing such as for a discrete time delay line, though no methods are known for compensation of charge transfer devices such as imaging devices having significant charge transfer inefficiencies. The lack of such information produces severe restrictions on the application of these devices, especially in areas of imaging where contrast ratios change monotonically and proportionally to the image position along the array axis, thus producing smearing from one end of the imaging device, though improving across the device to a well defined image at the other end.

The prior art methods for compensation in signal processing devices are applicable to circuits for signals which pass completely through the device, a condition not found in an imaging device. In particular, in an imaging device each pixel originates at a discrete position along the array. Consequently they do not all pass through every storage site in the charge transfer device, and hence leave behind varying amounts of signal residue that seemingly produce an indeterminate signal because of the fact that each signal pixel charge has had additions in different degrees proportional to the residue charge left behind by all preceeding pixels. Therefore the addition seemingly cannot be separated from the desired or observed pixel.

The principles which have been adopted and implemented with respect to signal delay line compensation have been discussed by many authors (Thornber, Karvel K., *Optimum Linear Filtering for Charge-Transfer Devices, IEE Journal of Solid-State Circuits*, vol. SC-9, No. 5, 1974; White, Marvin H., and Donald R. Lampe, *Charge Coupled Devices (CCD) Analog Signal Processing, International Conference on the Application of Charge-Coupled Devices*, Sponsored by Naval Lab Center, San Diego, CCD 75, 1975; and Sequin, Carlo H. and Michael F. Tompsett, *Charge Transfer Devices*, Academic Press, Inc., 1975. Probably the paper which has been referred to most is that of Karvel K. Thornber. In accordance with his work the effect of transfer inefficiency on the output of a signal processing device such as a delay device may be compensated for using a simple recursive filter on the output, the coefficients of which are selected dependent upon the transfer inefficiencies and the number of cells from input to output. However, for the reasons previously mentioned, such a compensation technique is not applicable to any devices wherein the total number of transfers required to shift any signal to the output varies, such as by way of example in imaging devices where the number of such transfers is dependent upon the relative position of the image segment.

BRIEF SUMMARY OF THE INVENTION

Methods and apparatus for compensating for charge transfer inefficiency in imaging and other variable length charge transfer devices are disclosed. In accordance with the method a recursive filter is used to compensate for the transfer inefficiency of the device with the coefficients of the recursive filter being dependent upon the pixel position and the inefficiency per transfer, or more particularly upon the inefficiency per transfer and the number of transfers required to transfer from the pixel position to the output of the charge transfer device. In addition, a variable gain control is used to restore the amplitude of the output signal dependent upon the pixel position and inefficiency per transfer. Substantial compensation is achieved utilizing recursive filter coefficients linearly increasing with the number of transfers required, with an automatic gain control amplifier also linearly increasing in gain proportional to the number of transfers required to restore signal amplitude. Test results and apparatus for practicing the invention are also disclosed, as are other compensation techniques.

BRIEF DESCRIPTION OF THE DRAWINGS

FIG. 1 is a block diagram of a two pole recursive filter.

FIG. 2a is a graphical illustration of the decay and shifting of an input pulse due to charge transfer inefficiency in a charge transfer device.

FIG. 2b is a time domain analysis of FIG. 2a.

FIG. 3 is a time domain analysis of the output of a theoretical five-call charge transfer device having a charge transfer inefficiency of $\epsilon$.

FIG. 4 is a circuit diagram of a linear compensation network for compensating the output of charge transfer devices having varying signal origins along the transfer line.

DETAILED DESCRIPTION OF THE INVENTION

Figure 5:
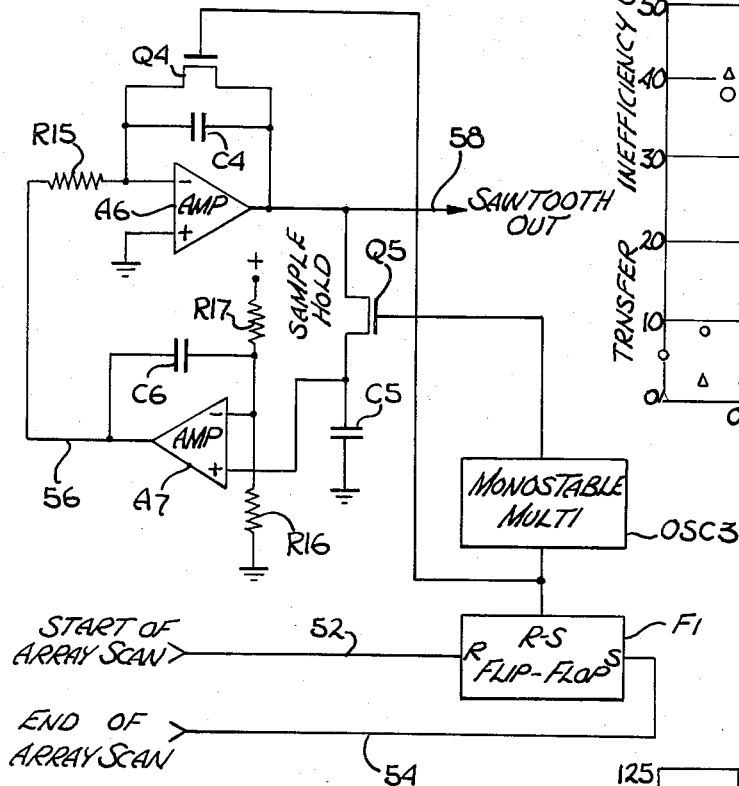
FIG. 5 is a circuit diagram of a self-compensating sawtooth generator which may be used with the compensation circuit of FIG. 4.

For a signal processing charge transfer device the modulation transfer function frequency response is given by the following equation:

$$|A_o/A_m| = \exp[-N\epsilon(1-\cos 2\pi f/f_c)]$$

where
  $A_o$ is the amplitude of output signal
  $A_m$ is the amplitude of input signal
  N is the number of transfers ε is the inefficiency per transfer
f is the signal frequency
$f_c$ is sampling frequency As previously mentioned, however, an imaging array may be characterized by the fact that the individual signals originate from different locations on the array so as to undergo different numbers of transfers before reaching the output. Further, it will be apparent that sharp images are characterized by sharp changes in the charge stored in adjacent cells. Consequently, if a frequency analysis were made for a row of cells in an imaging device, sharp images would be characterized by the higher frequency components which, if not appropriately compensated for, will result in loss of image contrast and smearing. While a detailed frequency domain analysis of the imaging device characteristics could be made, it is believed more appropriate for an understanding of the present invention to investigate a simple time domain analysis to better define the characteristic degradation due to charge transfer inefficiencies. Before doing so, however, the compensation of a signal processing device will first be discussed to provide a basis for the terminology and discussion to follow with respect to the present invention.

For compensation of a signal processing device wherein each signal undergoes the same number of transfers from input to output, compensation may be achieved by a recursive filter. Although a simple single pole recursive filter could be used, a two pole recursive filter is preferred because of the one pole filter's limited control over frequency response. Such a filter is shown schematically in FIG. 1. The filter is characterized by a summing point 20 and a pair of time delay (sample and hold) circuits 22 and 24 having negative feedbacks to the summing point 20 of α and β taken from nodes A and B respectively. The output itself is taken from node A.

FIGS. 2a and 2b demonstrate the mechanism of the correction process of a second order recursive filter, the general type shown in FIG. 1, in the time domain. The first line of FIG. 2a is an impulse signal having a duration of one sample time applied to an arbitrary charge transfer device with transfer inefficiency. The second line of this figure is the output of the charge transfer device to the same pulse which has suffered the transfer losses. FIG. 2b is the time-position diagram with the node voltages corresponding to those shown in FIG. 1. The transfer inefficiency of such devices is not a loss of charge on transfer but rather an incomplete transfer, leaving some fraction of the charge sought to be transferred in the cell. Thus, in FIG. 2a the leading sample pulse of the degraded impulse input signal to the recursive filter of FIG. 1 is assumed equal to unity and the residual signals are approximately equal to one-third for the following adjacent pulse and approximately equal to one-ninth for the next adjacent pulse. Other residue pulses are ignored. The feedback coefficients are $\alpha = \frac{1}{3}$ and $\beta = 1/9$. Under these conditions at time T=0 the unit impulse applied to the input will also appear at the summing point because points A and B will retain their zero values and no feedback occurs. At time T=1 the unity pulse will have transferred to point A which produces a unity output, and the residue of $\frac{1}{3}$ would have appeared at the input. Point A will feedback $\frac{1}{3}$ of the unit pulse to the α feedback path to subtract from the incoming $\frac{1}{3}$ signal, thereby providing a zero sum at the summing point. At time T=2 this zero transfers to point A. Meanwhile, the unit impulse would transfer to point B and the last residue of 1/9 would appear at the input. The pulse at point B is fed back through the β feedback path to again result in a zero sum. At time T=3 this zero transfers to point A yielding a state with the input and points A and B all going to zero. Thus within the three clock transitions an undistorted unit impulse is produced at the output.

The above only demonstrated the time domain processing that is implemented for a fixed transfer loss that is uniformly seen by all signal samples, and therefore cannot be applied directly to the imaging device which possesses other operating constraints as suggested earlier. These restrictions are examined in the following binominal expression (see the Thornber paper hereinbefore referred to) which gives a residual charge in the Nth storage cell with the nth sample clock $t_o$ when that cell has accummulated zero charges from all the preceeding m samples. The average charge transfer inefficiency is ε, and the signal charge $Q_0$ was originally transferred into the first cell.

$$Q_R(n\ t_0) = (1 - \epsilon)^N \sum_{m=1}^{\infty} \binom{N + m}{m} \epsilon^m Q_0((n + N - m)t_0)$$

$$\text{where } \binom{N + m}{m} = \frac{(N + m)!}{m!\,N!}$$

This expression can easily lead an investigator to assume that separating the residual terms in a given signal sample from its predecessor's residual information is virtually impossible. Furthermore, when the origination of the charge $Q_0$ is not in the first cell but in all the storage sites that are spatially positioned along the axis, it further complicates the concept of separating the signal components from their residual charges. However when these expanded terms are carefully examined, it becomes evident that under certain conditions these residuals can be separated from the desired signal pixel, particularly if ε less than $0.5 \times 10^{-3}$. An example of this expression is demonstrated by using a simple model of a five cell photo imaging charge transfer device with a charge transfer inefficiency ε. It is assumed that each cell has initially been stored with an arbitrary charge proportional to the light intensity on that particular site. FIG. 3 depicts this model in a time-position diagram showing the charges in each node for three clock cycles. Each cell contains charges that have been transferred from the previous storage site with a transfer gain of 1-ε while leaving behind ε of the transferred charge which subsequently accummulates on the next incoming charge packet. This process iterates with each clock transition and produces a large number of terms which are summed together. Listed below is the output after the fifth clock transition, which is primarily the output of the first storage position at time T=0 contaminated with residue terms.

7 $(1-\epsilon)^5$
$4\epsilon(1-\epsilon)^4$
4 $(1-\epsilon)^4\epsilon$
$2\epsilon^2(1-\epsilon)^3$
4 $(1-\epsilon)^4\epsilon$
$2\epsilon^2(1-\epsilon)^3$
2 $(1-\epsilon)^3\epsilon^2$
$5\epsilon^3(1-\epsilon)^2$
4 $(1-\epsilon)^4\epsilon$
$2\epsilon^2(1-\epsilon)^3$
2 $(1-\epsilon)^3\epsilon^2$
$5\epsilon^3(1-\epsilon)^2$
2 $(1-\epsilon)^3\epsilon^2$ $5\epsilon^3(1-\epsilon)^2$
$5(1-\epsilon)^2\epsilon^3$
$6\epsilon^4(1-\epsilon)$ The foregoing terms readily show that any residual terms that are expanded with powers greater than two may usually be neglected because each residual term carries an $\epsilon$ to the nth power as determined by the expansion. Furthermore, the lower powered terms in $\epsilon$ are only those contributed by the previous two samples. This characteristic is the response which is corrected by the second order filter as in the signal processing charge transfer devices. Thus, as the prior simplified time domain analysis has shown, a signal with this characteristic can be restored to reproduce the input signal by storing the two previous samples and subtracting a fraction of the charge in accordance with their contribution to the present incoming signal.

Up to this point it has been assumed that the initial condition exists with all signal samples starting in the first position, but the main criterion for this invention stems from the signal sample originating anywhere along the charge transfer device proportional to light energy impinging nearest a storage cell receiving the light integrated charge. To find a method to circumvent this problem the expanded terms have been studied. Observation of the terms in the residue expressions shows that the signals originating in any position produce output signals with identical characteristics to those observed with respect to FIG. 2a except that the number of transfers decrease as the originating signal proceeds from the first storage site to the last in proportion to the number of storage cells between the originating cell and the last cell. This signal behavior provides the deterministic property in the signal that can be used to reduce the degradation effect of the transfer efficiency in the imaging array because the second order filter process could provide the basic correction circuit while each of the coefficients could be made a linear function of the position of the originating cell. For example, the coefficients of FIG. 1 ($\alpha$ and $\beta$) can be controlled by a linear ramping voltage starting coincident with a scan of the charge coupled device. Letting the starting time be t=0, the following coefficients may be generated.

$\alpha = kt$ and $\beta = Kt$ for $0 \leq t \leq T_s$ where
t=time
$T_s$=scan-time of the array
k,K=constants determined by transfer inefficiency The control of these coefficients may be implemented, by way of example, either by a linear automatic gain control circuit driven with a sawtooth voltage or a multiplying digital-to-analog converter addressed with a digital ramp function.

It is also quite evident from the expansion that when the signal origination recedes from the last position, which is the first pixel seen at the output, the attenuation of the signal is greater because of the greater number of transfers. This produces signals at the output reduced by a factor:

$(1-\epsilon)^n = 1 - n\epsilon + \ldots -\epsilon^n$ where n is the number of transfers.

However, from the above expansion, the first two terms are the only significant factors for $\epsilon < 0.5 \times 10^{-3}$, hence the reduction in gain can be compensated with an automatic gain control amplifier linearly increasing in gain proportional to N$\epsilon$. This can be implemented by driving an automatic gain control amplifier with an offset sawtooth function to provide the initial gain of $A_0$ in a transfer function.

$A = A_0(1+\gamma t)$ where
$\gamma$ is the slope constant proportional to N$\epsilon$.

The above concept has been applied in implementing a circuit to compensate an imaging charge transfer device with a given charge transfer inefficiency to experimentally verify the presented arguments. The array selected for this experiment was an imaging device with a transfer inefficiency of $N\oplus = 0.35$. The specific circuit used for this experiment is shown in schematic form in FIG. 4. The circuit utilizes a pair of quadrant multipliers M1 and M2 manufactured and sold by the Raytheon Corporation as their RC4200 multiplier. As shown in the manufacturer's product specification for these devices, the devices operate substantially as current devices, providing an output current which may be converted to a voltage by an operational amplifier. In particular, the output of multiplier M1 is coupled to the negative input of the operational amplifier A1, the negative input thereof forming the summing junction of a compensation network. One of the inputs to the summing junction of amplifier A1 is the output received from the charge coupled device, converted to a current through resistor R1. Another input to the summing point of amplifier A1 is a ramp function provided through resistor R2 by the sawtooth generator G1, this input being a requirement of the multiplier. (See page 3, FIG. 2 and associated description in the Raytheon Preliminary product specification for the 4200 multiplexer, published November, 1977). Also provided to the summing junction is the output of the multiplier M1 representing the product of the input on line 40 through resistor R3 and the sawtooth generator ramp function through resistor R4. Finally, aside from feedback for the amplifier A1 provided through resistor R5 to set the gain thereof, the recursive feedback is provided thereto through line 42.

A pair of monostable pulsers PLS1 and PLS2 are triggered from the clock controlling the transfers in the charge transfer device, with the outputs of the monostable pulser being coupled through voltage translators VT1 to control the three sample and hold circuits comprising field effect device Q1 and capacitor C1, field effect device Q2 and capacitor C2, and field effect device Q3 and capacitor C3 respectively. Consequently, on each transfer the output is sampled by field effect device Q1 and held by the capacitor C1, with the output thereof being provided by buffer amplifier A2 on line 44. The output of the amplifier A2 is also provided to the summing junction of a third operational amplifier A3 through R6, that amplifier also receiving the output of the sawtooth generator G1 through R7 and the product of the network output and the sawtooth generator G1 output through resistors R8 and R9 respectively, R10 again setting the gain of the amplifier. The output of amplifier A3 is sampled by field effect device Q2, held by capacitor C3 and amplified by buffer amplifier A4 to provide the $\alpha$ feedback through resistor R11. Finally, the output of buffer amplifier A4 is sampled by field effect device A3, held by capacitor C3 and amplified by buffer amplifier A5 for feedback as the $\beta$ feedback through resistor R12, the $\alpha$ and $\beta$ feedbacks being fed back to the summing point of the operational amplifier A1.

In essence by proper selection of the resistors providing inputs to the multiplier M1 and the amplifier A1 the output of the amplifier may be made porportional to the product of the output of the charge transfer device times the ramp voltage initiated at the beginning of the scan, and in addition, because of the availability and ordinary function of the summing junction of the amplifier A1, may further include a voltage proportional to the output of the charge transfer device and negative components proportional to the $\alpha$ and $\beta$ feedbacks. Thus the output of $A_1$ of the amplifier A1 after the nth transfer is given by the following equation.

$$A_{1n} = K_1 A_n (1 + K_2 T) - K_3 \alpha_{fbn} - K_4 \beta_{fbn}$$

where $A_{1n}$ = output of amplifier A1 after nth transfer
$A_n$ = output voltage of the charge transfer device after the nth transfer
$K_1, K_2, K_3, K_4$ = selected constants
$\alpha_{fbn}, \beta_{fbn}$ = $\alpha$ and $\beta$ feedback after nth transfer The second automatic gain control amplifier and associated sample and hold circuit are all that are required to generate the feedback coefficients because the coefficients are zero at the beginning of the scan and approach a value proportional to $N\epsilon$ at the end of the scan, and because they only differ in the gradient of the correction slope. The provision of the third sample and hold circuit permits the signal to be fed back through the individual feedback paths for the $\alpha$ and $\beta$ feedback one sample time apart, which can be controlled separately to obtain the correct coefficient values. (In comparison to the circuit of FIG. 1, the compensation circuit output is taken from a different point, thereby providing the output signal at an earlier position.) Thus the $\alpha$ and $\beta$ feedbacks may be expressed as follows:

$$K_3 \alpha_{fbn} = k A_1 (n-1)^t$$

$$K_4 \beta_{fbn} = K A_1 (n-2)^t$$

where k,K = constants determined by transfer inefficiency (as before)
$A_{1(n-1)}, A_{1(n-2)}$ = output of amplifier A1 after (n=1) and (n=2) transfers The output of amplifier A1 after the nth transfer, assuming a unity gain on amplifier A1 and redefining coefficients as before, may be expressed as follows:

$$A_{1n} = A_n (1 + \alpha t) - kt - Kt$$

The linearly rising sawtooth voltage of the generator G1 is generated by a miller integrator amplifier with a sampling feedback arrangement to maintain a constant amplitude as the duty cycle is varied. A clamp technique activates the ramp function only during the signal scanning period. A schematic diagram of this circuit may be seen in FIG. 5.

The circuit is initiated by a start of array scan signal on line 52, with the ramp terminating on an end of array scan signal on line 54. The signal on line 52 resets the flip-flop F1 so as to turn OFF the field effect device Q4 to allow amplifier A6 to initiate a ramp voltage created by the feedback current through capacitor C4 to offset the current out of the summing point of the amplifier A6 through resistor R15 dependent upon the voltage on line 56 out of amplifier A7. At the end of the array scan the flip-flop F1 is set, causing the one-shot PLS3 to provide a short pulse to field effect device Q5 to sample and hold the maximum ramp output on capacitor C5 while immediately thereafter device Q4, being turned ON by the flip-flop F1, discharges capacitor C4, effectively dropping the output of the sawtooth generator on line 58 to zero. It will be noted that amplifier A7 has its inverting input coupled to a reference voltage determined by resistors R16 and R17 with feedback being provided through a relatively large capacitor C6. When the circuit is first turned on and cycling begins, capacitors C5 and C6 generally will be uncharged. Consequently, the voltage on line 56 will initially be near zero and a negligible ramp output will be provided. However, because of the reference voltage applied to the inverting input of amplifier A7 the output thereof starts going negative at a rate dependent substantially upon the value of capacitor C6, this rate being relatively slow in comparison to the repetition rate of the array scan. The negative voltage on line 56 causes the ramp generator to start providing ramp outputs having an amplitude proportional to the voltage on line 56, which voltage as stated before is sampled and held by capacitor C5. When the sampled voltage on capacitor C5 reaches the reference voltage determined by resistors R16 and R17, the differential input of amplifier A7 to zero (assuming ideal amplifiers) so that the output on line 56 remains at the then existing negative voltage to stabilize the ramp generator at the desired output. Thus if the rate of scan is subsequently changed the circuit will automatically adjust the slope of the ramp generated so that the ramp amplitude will remain constant, and the ramp voltage at the time of any transfer will be directly proportional only to the number of transfers since the ramp was last initiated.

Both coefficients and the automatic gain control amplifier gains were determined by the transfer inefficiency of the device. The transfer inefficiency of the experimental charge transfer device as measured corresponds to $N\epsilon \approx 0.35$. Accordingly, the sawtooth control voltage has been adjusted to control amplifier A1 to provide a voltage gain of $A_o \approx \frac{1}{2}$ at the beginning of the scan and $(1.35)(\frac{1}{2})$ at the end of scan. The second automatic gain control amplifier has been set to provide a voltage gain of zero at the beginning and greater than 0.5 at the end scan. These levels exceed the requirements to remove the first and second order residue signal. Then, adjustment of the feedback resistors for each coefficient to match the trailing residue of the last sample, as shown in FIG. 2a, provides the corresponding coefficients to correct the output response from the beginning to the end of the array.

These coefficients and therefore the resistor values can also be closely calculated if the total transfer inefficiency, $N\epsilon$, is less than 0.7; then the total transfer inefficiency is $$N\epsilon = \frac{\Delta A_1 + \Delta A_2}{A + \Delta A_1 + \Delta A_2} \text{ (assuming first and second order errors only)}$$

and $$\Delta A_2 \approx N\epsilon \Delta A_1$$

where

A = amplitude of leading impulse $\Delta A_1$ = amplitude of first trailing residue sample after the impulse signal $\Delta A_2$ = amplitude of the second trailing residue sample after the impulse signal Then each feedback coefficient may be calculated using the following ratios to give $\alpha$ and $\beta$.

$$\alpha = \frac{\Delta A_1}{A + \Delta A_1 + \Delta A_2} \text{ and } \beta = \frac{\Delta A_2}{A + \Delta A_1 + \Delta A_2} \simeq N\epsilon\Delta A$$

A series of measurements have been conducted with the experimental array, using the circuit as described above. All the measurements have virtually ignored any characteristics, advantageous or otherwise, of the optics systems, because the measurements observed have been directly compared with the image from the array outputs both before and after the compensation network. To expedite the measurements, only one video line of the CCPD-1024 (a Reticon Corporation imaging device) has been used. Normally these arrays are used with both output videos multiplexed together from two charge transfer device transports to obtain 1024 elements, thus the measurements reported apply to a 512-cell array. These measurements have been separated into three comparative measurements:

1. Optical impulse response
2. Modulation transfer function at the Nyquist frequency
3. Modulation transfer function; output amplitude versus spatial frequency.

Optical impulse signals were produced at the array with a spotlight source from a microscope illuminating a single cell. The Tungsten-light source was filtered with an HA-11 blue filter. The spot size was focused to be just slightly smaller than the light gathering aperture of the experimental charge transfer device. The spot was then used to expose each individual cell from the first position to the last, illuminating each cell sequentially while measuring the transfer inefficiency at these positions.

Photographs were made showing the video impulse produced by an impulse light applied to the cell closest to the device output to approximately the middle cell and to the last cell, both for an uncompensated and a compensated output. As would be expected, the uncompensated response for the cell closest to the output showed that compensation was unnecessary because the transfer inefficiency is a negligible quantity. Of course the compensated output was essentially unchanged as the feedback coefficients are zero in the automatic gain control compensation has not yet taken hold. For the mid-position response the uncompensated response provided two residual samples trailing behind the impulse signal with both residuals being in significant proportion. That same signal after correction, however, exhibited an increased amplitude in the primary signal and grossly reduced residuals. For the pixel that was transferred from the last cell position (i.e. furthest away from the output and therefore has undergone maximum transfer losses), the uncompensated signal exhibited nearly a 50% attenuation in the primary signal and very substantial residuals, whereas the compensated signal had substantially the same amplitude as the first and mid-point cell signals with detectable though very low residuals.

The foregoing photographic measurements were taken at various other points. Instead of showing all points of the 512 cells the array has been segmented into ten parts each with approximately 50 diodes. These segments have been normalized against the whole length of the array such that the positions are represented by fractional numbers with the results being presented in the graph of FIG. 6. The vertical axis is transfer inefficiency expressed as a percentage. The upper curve shows a loss in the uncompensated output. The initial offset at the origin of the uncompensated curve is attributed to the optical lateral diffusion modulation transfer function of the device. The compensated output starts at zero at the origin with the shift attributed to the over compensation produced at the beginning of the scan. This over compensation is evident when linearity near the origin of the correcting sawtooth ramp is observed. A small segment probably unnoticeable in the sawtooth waveform provided by the circuit of FIG. 5 rises immediately with a greater slope than in the mid-sections of the ramp and then after a few microseconds converges to the mid-section slope. As will be seen, the effect is quite negligible when compared to the performance improvement of the array. Even this preliminary curve shows a reduction from 36% transfer inefficiency to effectively 12%, though of course, it would be expected that improvements in the ramp, adjustment of the coefficients, etc. using the concepts of the present invention could provide further overall improvement.

Figure 6:
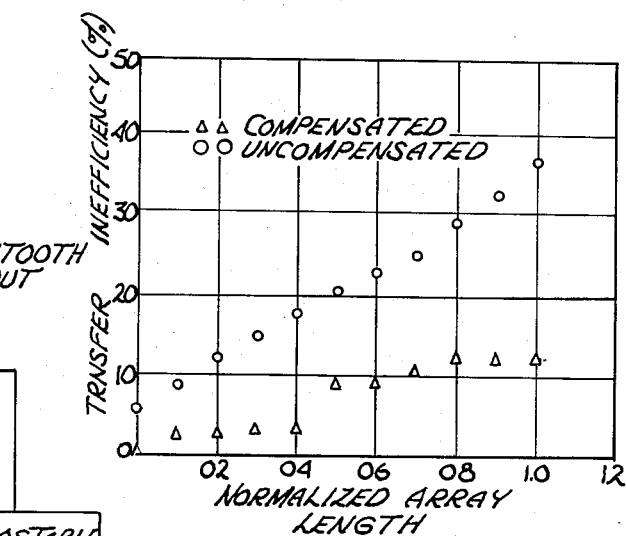
FIG. 6 is a graph illustrating the compensated and uncompensated transfer inefficiency of a device utilizing the circuit of FIG. 4.
Figure 7:
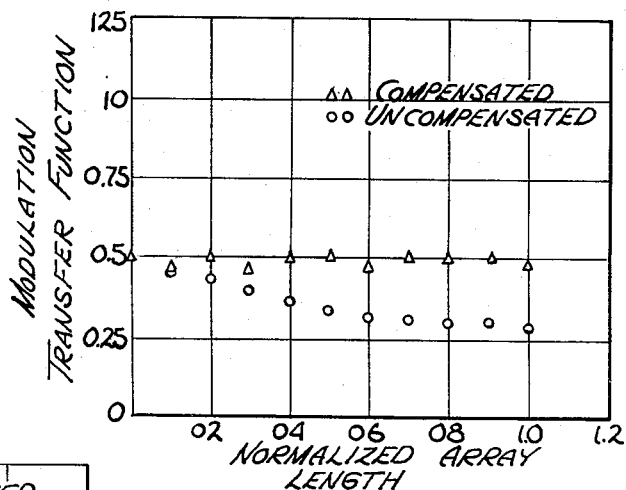
FIG. 7 and FIG. 8 are graphs illustrating the compensated and uncompensated modulation transfer function for a device using the compensation circuit of FIG. 4 under specific test conditions.

Modulation transfer measurements at the spatial Nyquist frequency were taken with a simple optical measurement system which was composed of a tungsten light source at 2780° K. filtered with an HA-11 blue filter, and collimated with a simple lens system. Light from this source was passed through a chrome transparent bar chart with each group of three bars uniformly spaced but with the different three bar group varied in line-to-line spacing. Following the bar chart was another simple lens to focus the bar patterns onto the array. The desired spatial frequency and phase were selected by adjusting the magnification of the system and selecting the group having the appropriate number of lines per millimeter. Again separate photographs of the modulation transfer function at the spatial Nyquist frequency were taken, which photographs simultaneously provided both the uncompensated and the compensated signals. FIG. 7 is a graph of the modulation transfer function amplitude at the spatial Nyquist frequency plotted along the normalized length of the array as described above with respect to FIG. 6. The top curve is for the compensated output and the bottom curve for the uncompensated output. Again, this measurement shows a vast improvement as the modulation transfer function falls almost linearly to 0.3 from 0.5 for an uncompensated output while the compensated video remains essentially flat at approximately 0.5.

Figure 8:
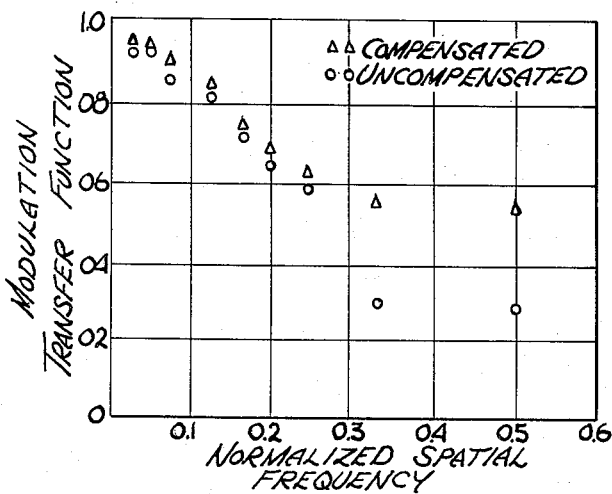

The modulation transfer function is a function of spatial frequency at the degraded end of the array has been measured. This measurement was obtained with the same optical system as in the foregoing Nyquist frequency measurement. The spatial frequency was varied as described above and comparative output videos, compensated and uncompensated, were taken simultaneously. FIG. 8 is the modulation transfer function graph taken at the degraded end of the array. This graph is plotted with amplitude normalized to the DC spatial frequency and with the spatial frequency normalized to the total samples. It shows the compensated curve at the top and the uncompensated curve at the bottom. The improvement exhibited is amply sufficient to warrant use of the compensation circuit in many of the charge transfer devices applications.

Through heuristic arguments based on the properties of the expanded terms of the binominal residue expansion and based on prior experimental work in correcting a signal-processing charge transfer device's modulation transfer function response as degraded by charge-transfer efficiency, it has been shown that an imaging charge transfer device with similar degradation can be improved, thus leading to an experimental circuit and measurements to verify the assumptions and arguments presented herein. It may be seen from the measurements that the performance is markedly improved with a simple and unsophisticated circuit that has substantiated the arguments in the concept. All measurements were taken at below 250 KHz sampling rate to expedite the implementation of the automatic gain control amplifiers; the linearity of the linear ramp sawtooth generator was not especially considered; and the tracking of gains between the two automatic gain control amplifiers were not thoroughly examined. Yet, the modulation transfer function properties were substantially enhanced, which strongly indicates that even further improvements in the compensation circuit and selection of correction coefficients may be expected to yield improved compensation over that shown in the attached drawings.

There has been described herein unique methods and apparatus for the compensation of charge transfer inefficiency particularly useful in transfer devices characterized by a fact that different signals undergo different numbers of transfers to reach the output thereof. As one example of such devices, the requirements of an imaging charge transfer device have been described in detail and specific measurements using a specific compensation circuit illustrating the advantages thereof have been presented. It should be noted, however, that the present invention is not limited to imaging devices, as by way of specific example, any such device which may be characterized as a parallel-in, serial-out device will have cause to use the methods and apparatus of the present invention. In that regard, signal processing charge transfer devices characterized by a parallel input and serial output have the described characteristics and as a result thereof, the present invention is also applicable to such devices. Further, it should be noted that the specific embodiment hereinbefore described in detail is characterized by a first order correction in the amplitude of the output signal in the form of $1+\gamma t$ and a second order recursive correction for the output contributions of preceding signals, i.e. recursive corrections for the preceding two signals. Obviously, circuits for providing lessor or greater orders of correction may readily be designed by those skilled in the art from the disclosure given herein, such as, by way of example, for the utilization of a first order recursive filter or for providing higher order gain and/or recursive correction.

Figure 9:
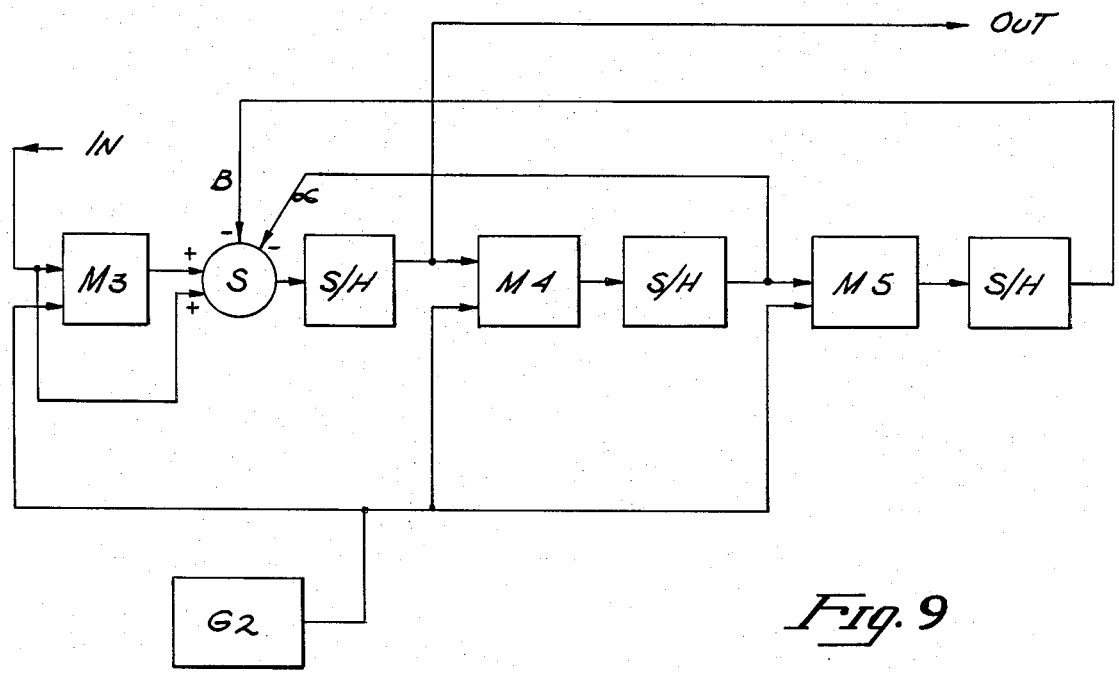
FIG. 9 is a block diagram of an alternate compensation circuit using square law feedback for the $\beta$ compensation.

It should be noted that the linear corrections provided for herein were selected in part for their compensating characteristic and in part because of their ease of implementation. The test results verifying the value and utility in the use of these circuits, however, is but one example of possible forms of compensation. A block diagram of another possible compensation circuit is shown in FIG. 9. This circuit provides an $\alpha$ feedback proportional to t and a $\beta$ feedback proportional to $t^2$. In particular, it was previously noted that for determining the resistor values $\Delta A_2$ approximately equals $N\epsilon\Delta A_1$ for the overall device. For any intermediate cell, however, the same general equation applies in that $\Delta A_2$ approximately equal to $n\epsilon\Delta A_1$. Since $n\epsilon$ is proportional to t for a device operating at a given transfer frequency, this analysis would suggest that compensation in the form of $\alpha = kt$ and $\beta = Kt^2$ is theoretically desirable. This conclusion is supported also by an investigation of the error coefficients, i.e. the number of times an error on the order of $\epsilon$ occurs in an output due to the next adjacent cell, and the number of times an $\epsilon^2$ error occurs due to the charge in the second preceding cell, as determined by a time domain analysis similar to that done with respect to FIG. 4 and the description thereof. In particular, it will be noted that after the first clock cycle no $\epsilon$ or $\epsilon^2$ errors occur. After the second clock cycle one $\epsilon$ error occurs and no $\epsilon^2$ errors occur; i.e. the charge from the fourth cell has been shifted to the output in an attenuated form, with the charge originally in the fifth cell of magnitude six contributing once to the $\epsilon$ error. If this expansion is continued, it is found that the $\epsilon$ error is truly linear, having an occurrence of zero for the first clock time, one the second clock time, two the third clock time, etc. (Note that in the list of terms after the fifth clock cycle hereinbefore presented the same $\epsilon$ error repeats four times.) Using the time reference suggested by FIG. 3, the $\alpha$ compensation should therefore be proportional to $n-1$, (i.e. linear with n) or linear with time for a fixed shift frequency. The same analysis shows that the first $\alpha^2$ error occurs once after the third clock cycle and reoccurs thereafter at the rate of $(n-1)(n-2)/2$, yielding a reoccurrence of six times on the fifth clock cycle as shown in the list of terms hereinbefore listed. Thus the $n^2$, or the $t^2$ dependence for a given transfer frequency, or still further a $t^2$ dependence having a reduced slope in accordance with any reductions in the transfer frequency if a ramp generator in accordance with FIG. 5 is used, will provide this form of compensation. A block diagram of such a circuit may be seen in FIG. 9. In this figure the output of the charge transfer device is applied to multiplier M3 and also a summing junction S. The ramp generator G2 provides the required ramp to the multiplier M3 so that the output of the multiplier M3 in conjunction with the input to the circuit provides the gain control components to the summing junction. As before, the summing junction is sampled and held to provide the output, with that signal also being coupled to multiplier M4 and a second sample and hold circuit to provide the $\alpha$ feedback. In that regard, multipliers M3 and M4 and the ramp generator G2 may be substantially identical in function to multipliers M1 and M2 in FIG. 4. The $\beta$ feedback, however, is derived from the $\alpha$ feedback through a third multiplier M5 and associated sample and hold circuit so that the $\beta$ feedback is effectively proportional to the product of the $\alpha$ feedback and time, thereby providing approximately a $t^2$ dependence.

In the explanations provided herein, n and t have been used substantially interchangably. In that regard it should be noted that $n = ft$, where n is the number of transfers, f is the frequency of the transfers (i.e. transfers per second) and t is time. Obviously, for a fixed transfer frequency n and t are directly proportional, even for variable transfer frequency. However, utilizing a sawtooth generator of the general type shown in FIG. 5 the slope of the ramp is effectively proportional to the frequency so that the direct proportion n and the ramp function is maintained, making n and t interchangeable independent of f.

One final point should be noted with respect to the methods and apparatus disclosed herein. In any device which is likely to need the compensation herein described N will generally be much greater than 1, and the difference in the α and β feedback for adjacent signals will usually be negligible, though of course will accumulate to substantial differences over significant fractions of the cell row. Consequently it makes very little difference as to whether the α and/or β feedbacks are proportional to n = the number of transfers to provide the output signal being corrected, or n = the number of transfers which provided the output signal on which the α and/or β corrections are based. By way of example, in the circuit of FIG. 4 one device output signal is multiplied by the ramp of multiplier M2 to be sampled and held in the capacitor C2 upon the next transfer for compensation of the newly transferred output. As such, this circuit determines the α compensation based upon n = the number of transfers to obtain the device output on which the α compensation is based. That same compensation is sampled and held upon the next transfer to provide the β feedback so that the β feedback is actually based on the same value of n as the α feedback. In the embodiment of FIG. 9, on the other hand, assuming that the sample and hold circuits are initially cleared, the first clock pulse transfers the charge from the last cell to the input for the circuit for the first sample and hold to hold that input (corrected in insignificant amounts in amplitude by the multiplier M3). No α and β feedback is provided as a second and third sample and hold circuits are holding zero. On the second clock pulse the first output is multiplied by the ramp output at that time and again sampled and held, thereby providing the first α feedback based on n = 2. On the third transfer the α term is again multiplied by n (now n = 3) and sampled and held for the β feedback. Consequently, the β feedback in this case is proportional to (n)(n − 1). Obviously only a very slight delay in the ramp would effectively convert these to the n − 1 dependence ideally desired for the α feedback and the (n − 1)(n − 2) dependence in the β feedback, though these differences are in general very slight. Consequently in most cases of interest it may be assumed that $$N >> 1 \text{ and } n \approx n-1 \approx n-2$$

Therefore an embodiment similar to the embodiment of FIG. 9 which in fact used a square law device to provide a β feedback proportional to $n^2$(or $(n-1)^2$, etc.) is, except for very slight differences, equivalent to the circuit of FIG. 9. Consequently compensation using a compensating component dependig on or proportional to n or $n^2$ is also approximately dependent upon or proportional to n−1or $(n-1)^2$, etc. provided this approximation is used only for a very narrow range of n which is a very small part of N.

While certain preferred embodiments have been disclosed and described in detail herein, it will be understood by those skilled in the art that various changes in form and detail may be made therein without departing from the spirit and scope of the invention.

I claim:

1. A method of compensating for charge transfer inefficiency in charge transfer devices having varying numbers of discrete charge transfers to sequentially shift each signal from its original storage cell to the device output comprising the steps of:
   (a) for each device output signal, preserving a signal responsive to that output signal for at least one subsequent transfer; and
   (b) compensating the subsequent output signal after the subsequent transfer by combining the preserved signal with the subsequent device output signal in a varying amount, the varying amount being dependent upon the approximate number of transfers that were required for the preserved signal to shift from its origin in the device to the output thereof.

2. The method of claim 1 wherein steps (a) and (b) of claim 1 are preceded by the step of increasing the magnitude of each device output signal by an amount dependent upon the approximate number of transfers that were required to shift that signal from its origin in the device to the output thereof.

3. The method of claim 1 wherein the preserved signal is itself a compensated output signal previously provided in accordance with steps (a) and (b) of the method.

4. The method of claim 1 wherein the preserved signal is combined with the subsequent device output signal by subtracting the preserved signal from the subsequent device output signal in an amount dependent upon the approximate number of transfers that were required for the preserved signal to shift from its origin in the device to the output thereof.

5. The method of claim 4 wherein steps (a) and (b) of claim 1 are preceded by the step of increasing the magnitude of each device output signal by an amount dependent upon the number of transfers that were required to shift that signal from its origin in the device to the output thereof.

6. The method of claim 4 wherein each preserved signal is subtracted from the device output signal resulting after the next transfer in an amount approximately directly proportional to the number of transfers that were required for the preserved signal to shift from its origin in the device to the output thereof.

7. The method of claim 6 wherein steps (a) and (b) of claim 1 are preceded by the step of increasing the magnitude of each device output signal by an amount dependent upon the number of transfers that were required to shift that signal from its origin in the device to the output thereof.

8. The method of claim 6 wherein steps (a) and (b) of claim 1 are preceded by the step of increasing the magnitude of each device output signal by an amount approximately directly proportional to the number of transfers that were required for the subsequent signal to shift from its origin in the device to the output thereof.

9. The method of claim 6 wherein a signal responsive to each device output signal is preserved for at least two subsequent transfers, and wherein each preserved signal is also subtracted from the device output signal resulting after the next two transfers, each in a different proportion dependent upon the number of transfers that were required for the subsequent signal to shift from its origin in the device to the output thereof.

10. The method of claim 9 wherein steps (a) and (b) of claim 1 are preceded by the step of increasing the magnitude of each device output signal by an amount dependent upon the number of transfers that were required to shift that signal from its origin in the device to the output thereof.

11. The method of claim 9 wherein steps (a) and (b) of claim 1 are preceded by the step of increasing the magnitude of each device output signal by an amount approximately directly proportional to the number of transfers that were required for the subsequent signal to shift from its origin in the device to the output thereof.

12. The method of claim 9 wherein the subtraction of each preserved signal from the device output signal resulting after the next two transfers is in an amount approximately directly proportional to the number of transfers that were required for that output signal to shift from its origin in the device to the output thereof.

13. The method of claim 12 wherein steps (a) and (b) of claim 1 are preceded by the step of increasing the magnitude of each device output signal by an amount dependent upon the number of transfers that were required to shift that signal from its origin in the device to the output thereof.

14. The method of claim 12 wherein steps (a) and (b) of claim 1 are preceded by the step of increasing the magnitude of each device output signal by an amount approximately directly proportional to the number of transfers that were required for the subsequent signal to shift from its origin in the device to the output thereof.

15. The method of claim 9 wherein the subtraction of each preserved signal from the device output signal resulting after the next two transfers is in an amount directly proportional to the square of the approximate number of transfers that were required for that output signal to shift from its origin in the device to the output thereof.

16. The method of claim 15 wherein steps (a) and (b) of claim 1 are preceded by the step of increasing the magnitude of each device output signal by an amount dependent upon the number of transfers that were required to shift that signal from its origin in the device to the output thereof.

17. The method of claim 15 wherein steps (a) and (b) of claim 1 are preceded by the step of increasing the magnitude of each device output signal by an amount approximately directly proportional to the number of transfers that were required for the subsequent signal to shift from its origin in the device to the output thereof.

18. A method of compensating for charge transfer inefficiency in charge transfer devices having varying numbers of charge transfers to shift each signal from its original storage cell to the device output comprising the steps of:
(a) for each device output, varying the amplitude of the device output in accordance with the approximate number of transfers required to provide that device output, thereby providing an amplitude adjusted output signal;
(b) sampling and holding a signal responsive to the amplitude adjusted output signal for at least one additional transfer, and
(c) after the next subsequent transfer, feeding back the amplitude adjusted signal being held in an amount dependent on the approximate number of transfers to provide those device outputs, the feedback reducing the amplitude adjusted signal to provide a compensated output signal.

19. The method of claim 18 wherein the signal sampled and held in step (b) is itself a signal compensated in accordance with the method of claim 18.

20. The method of claim 19 wherein the amplitude of the device output is varied in step (a) by multiplication of the amplitude by a gain factor having an initial gain which increases substantially linearly with the approximate number of transfers required to provide that device output signal.

21. The method of claim 20 wherein the signal fed back in step (c) is fed back in an amount directly proportional to the approximate number of transfers to provide those device outputs.

22. The method of claim 21 wherein a signal responsive to the signal sampled and held in step (b) is held for at least a second transfer, steps (a), (b) and (c) are repeated on the second transfer device output signal, and further comprising the additional step of feeding back this additional signal in an amount dependent on the approximate number of transfers to provide these device outputs to further reduce the second transfer device output to provide further compensation.

23. Apparatus for compensating for charge transfer inefficiency in charge transfer devices having varying number of discrete charge transfers to sequentially shift each signal from its original storage cell to the device output comprising
recursive filter means for altering each output signal of the device by a correction signal responsive to at least one immediately prior output signal, and
control means coupled to said recursive filter means for varying the relative amplitude of the correction signal by an amount dependent upon the approximate number of transfers that were required to provide the respective output signal.

24. The apparatus of claim 23 further comprised of amplitude adjustment means for coupling to the device output and coupled to said recursive filter input, said amplitude adjustment means being a means for providing a gain increasing in response to the number of transfers that were required to provide said device output signal.

25. The apparatus of claim 24 wherein said amplitude adjustment means is a means for providing an initial gain increasing directly proportional to the approximate number of transfers required to provide said device output signal.

26. Apparatus for compensating for charge transfer inefficiency in charge transfer devices having varying numbers of charge transfers to shift each signal from its original storage cell to the device output comprising
recursive filter means for altering a device output signal by a correction signal responsive to at least one immediately prior output signal,
control means coupled to said recursive filter means for varying the relative amplitude of the correction signal dependent upon the approximate number of transfers that were required to provide said device output signal, said control means comprises a ramp generating means for generating a control signal linearly increasing with the number of device transfers, and
amplitude adjustment means for coupling to the device output and coupled to said recursive filter input, said amplitude adjustment means being a means for providing an initial gain increasing directly proportional to the approximate number of transfers required to provide said device output signal.

* * * * *